United States Patent
McTaggart et al.

(10) Patent No.: US 11,362,201 B1
(45) Date of Patent: Jun. 14, 2022

(54) HETEROJUNCTION BIPOLAR TRANSISTORS WITH UNDERCUT EXTRINSIC BASE REGIONS

(71) Applicant: GLOBALFOUNDRIES U.S. Inc., Santa Clara, CA (US)

(72) Inventors: Sarah McTaggart, Essex Junction, VT (US); Qizhi Liu, Lexington, MA (US); Vibhor Jain, Essex Junction, VT (US); Mark Levy, Williston, VT (US); Paula Fisher, Milton, VT (US); James R. Elliott, Huntington, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 25 days.

(21) Appl. No.: 17/120,916

(22) Filed: Dec. 14, 2020

(51) Int. Cl.
*H01L 29/737* (2006.01)
*H01L 29/66* (2006.01)

(52) U.S. Cl.
CPC .... *H01L 29/7375* (2013.01); *H01L 29/66242* (2013.01)

(58) Field of Classification Search
CPC .......... H01L 29/0817; H01L 29/66242; H01L 29/7371; H01L 29/7375; H01L 2924/13051
See application file for complete search history.

(56) References Cited

U.S. PATENT DOCUMENTS

| | | |
|---|---|---|
| 8,067,290 B2 | 11/2011 | Boeck et al. |
| 9,070,734 B2 | 6/2015 | Camillo-Castillo et al. |
| 9,159,817 B2 | 10/2015 | Camillo-Castillo et al. |
| 9,202,900 B2 | 12/2015 | Adkisson et al. |
| 9,245,951 B1 | 1/2016 | Camillo-Castillo et al. |
| 9,318,551 B2 | 4/2016 | Camillo-Castillo et al. |
| 9,368,608 B1 | 6/2016 | Camillo-Castillo et al. |
| 10,217,852 B1 * | 2/2019 | Liu ...................... H01L 29/7371 |
| 10,312,356 B1 * | 6/2019 | Liu ........................ H01L 29/165 |

* cited by examiner

*Primary Examiner* — Syed I Gheyas
(74) *Attorney, Agent, or Firm* — Thompson Hine LLP; Anthony Canale

(57) ABSTRACT

Device structures and fabrication methods for heterojunction bipolar transistors. Trench isolation regions are positioned in a semiconductor substrate to define active regions. A base layer includes first sections that are respectively positioned over the active regions and second sections that are respectively positioned over the trench isolation regions. Emitter fingers are respectively positioned on the first sections of the base layer. The first sections of the base layer include single-crystal semiconductor material, and the second sections of the base layer include polycrystalline semiconductor material. The second sections of the base layer are spaced in a vertical direction from the trench isolation regions to define a first cavity that extends about a perimeter of the base layer and second cavities that are connected to the first cavity.

20 Claims, 11 Drawing Sheets

HETEROJUNCTION BIPOLAR TRANSISTORS WITH UNDERCUT EXTRINSIC BASE REGIONS

BACKGROUND

The invention relates generally to semiconductor device and integrated circuit fabrication and, in particular, to device structures and fabrication methods for heterojunction bipolar transistors.

A bipolar junction transistor is a three-terminal electronic device that includes an emitter, a collector, and an intrinsic base arranged between the emitter and collector. In an NPN bipolar junction transistor, the emitter and collector may be comprised of n-type semiconductor material, and the intrinsic base may be comprised of p-type semiconductor material. In a PNP bipolar junction transistor, the emitter and collector may be comprised of p-type semiconductor material, and the intrinsic base may be comprised of n-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which at least two of the collector, emitter, and intrinsic base are comprised of semiconductor materials with different energy bandgaps, which creates heterojunctions. For example, the collector and/or emitter of a heterojunction bipolar transistor may be comprised of silicon, and the intrinsic base of a heterojunction bipolar transistor may be comprised of silicon germanium, which is characterized by a narrower band gap than silicon.

In some applications like power amplifiers, the emitter of a heterojunction bipolar transistor may include multiple emitter fingers. An extrinsic base region is arranged between and about the pairs of emitter fingers. These extrinsic base region is a source of parasitic capacitance that may adversely impact device performance.

Improved structures and fabrication methods for heterojunction bipolar transistors are needed.

SUMMARY

In an embodiment of the invention, a device structure is provided for a heterojunction bipolar transistor. The device structure includes a plurality of trench isolation regions positioned in a semiconductor substrate to define a plurality of active regions, a base layer including a plurality of first sections that are respectively positioned over the active regions and a plurality of second sections that are respectively positioned over the trench isolation regions, and a plurality of emitter fingers respectively positioned on the first sections of the base layer. The first sections of the base layer include single-crystal semiconductor material, and the second sections of the base layer include polycrystalline semiconductor material. The second sections of the base layer are spaced in a vertical direction from the trench isolation regions to form a first cavity that extends about a perimeter of the base layer and a plurality of second cavities surrounded by the first cavity.

In an embodiment of the invention, a method of fabricating a heterojunction bipolar transistor is provided. The method includes forming a plurality of trench isolation regions in a semiconductor substrate that define a plurality of active regions, and forming a base layer that includes a plurality of first sections containing single-crystal semiconductor material that are respectively positioned over the active regions and a second plurality of sections containing polycrystalline semiconductor material that are respectively positioned over the trench isolation regions. The method further includes removing a first semiconductor layer of each of the second sections of the base layer selective to a second semiconductor layer of each of the second sections of the base layer to define a first cavity and a plurality of second cavities that are positioned in a vertical direction between the second semiconductor layer and the trench isolation regions. The first cavity extends about a perimeter of the base layer and the second cavities are surrounded by the first cavity. The method further includes forming a plurality of emitters respectively positioned on the first sections of the base layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
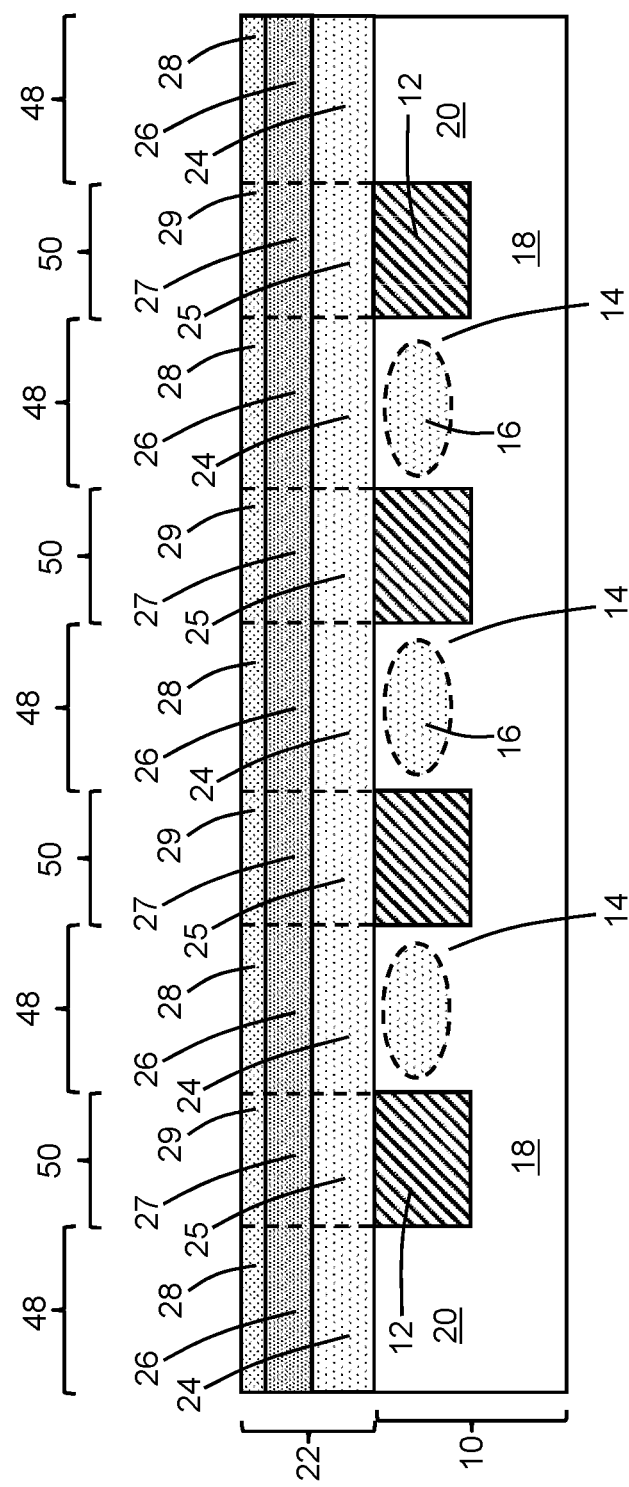
FIG. 1 is a cross-sectional view of a device structure at an initial fabrication stage of a processing method in accordance with embodiments of the invention.

With reference to FIG. 1 and in accordance with embodiments of the invention, a semiconductor substrate 10 may be comprised of a single-crystal semiconductor material, such as single-crystal silicon. The single-crystal semiconductor material of the semiconductor substrate 10 may include an epitaxial layer at its top surface, and the epitaxial layer may be doped with an electrically-active dopant to alter its electrical conductivity. For example, an epitaxial layer of single-crystal silicon may be grown on the semiconductor substrate 10 by an epitaxial growth process, and may be doped during epitaxial growth with an n-type dopant (e.g., phosphorus and/or arsenic) to provide n-type electrical conductivity.

Trench isolation regions 12 are formed in the semiconductor substrate 10 and are positioned to surround active regions 14 of the semiconductor substrate 10. The trench isolation regions 12 may be formed by a shallow trench isolation technique that relies on lithography and etching processes to define trenches in the semiconductor substrate 10, deposits a dielectric material to fill the trenches, and planarizes the dielectric material using chemical mechanical polishing. The dielectric material may be, for example, silicon dioxide that is deposited by chemical vapor deposition.

A collector 16 includes a section positioned in each active region 14 and each collector section may constitute all or a portion of the respective active region 14. The electrical conductivity of the collector 16 may be elevated relative to the semiconductor substrate 10 by, for example, an ion implantation of an electrically-active dopant, such as an n-type dopant, into a central portion of the active region 14. A subcollector 18 extends laterally in the semiconductor substrate 10 beneath the outermost trench isolation regions 12 in order to couple the collectors 16 with a collector contact region 20, which is positioned outside of the trench isolation regions 12 and active regions 14. The subcollector 18 may be formed beneath the top surface of the semiconductor substrate 10 by introducing an electrically-active dopant, such as an n-type dopant (e.g., phosphorus and/or arsenic), to provide n-type electrical conductivity.

A base layer 22 is formed as a continuous film over the active regions 14, the trench isolation regions 12, and the collector contact region 20. The base layer 22 may include multiple layers 24, 26, 28 containing single-crystal semiconductor material that are stacked in sections 48, as well as multiple layers 25, 27, 29 containing polycrystalline semiconductor material that are stacked in sections 50. The sections 48 are respectively positioned in vertical alignment with the active regions 14, and the sections 48 may directly contact the single-crystal semiconductor material of the respective active region 14. The sections 50 are positioned directly over, and overlap with, the trench isolation regions 12. The polycrystalline layers 25, 27, 29 respectively adjoin the single-crystal layers 24, 26, 28.

The single-crystal layer 24 in the sections 48 of the base layer 22 adjoins and is continuous with the polycrystalline layer 25 in the sections 50 of the base layer 22. The single-crystal layer 26 in the sections 48 of the base layer 22 adjoins and is continuous with the polycrystalline layer 27 in the sections 50 of the base layer 22. The single-crystal layer 28 in the sections 48 of the base layer 22 adjoins and is continuous with the polycrystalline layer 29 in the sections 50 of the base layer 22. Although the thicknesses of the base layer 22 in sections 48 and sections 50 are shown as being equal, these thicknesses may differ. The transitions between the polycrystalline layers 25, 27, 29 in each section 50 of the base layer 22 and the single-crystal layers 24, 26, 28 in the adjacent sections 48 of the base layer 22 occur along respective interfaces, which are diagrammatically indicated by the dashed lines. Although the interfaces are shown as vertically oriented, the interfaces may be inclined at an angle that is less than 90° or at an angle that is greater than 90°.

The single-crystal layers 26 and polycrystalline layers 27 of the base layer 22 may be comprised of a semiconductor material, such as silicon-germanium including silicon and germanium combined in an alloy with the silicon content ranging from 95 atomic percent to 50 atomic percent and the germanium content ranging from 5 atomic percent to 50 atomic percent. The germanium content of the single-crystal layers 26 and polycrystalline layers 27 of the base layer 22 may be uniform across their respective thicknesses or may be graded and/or stepped across their respective thicknesses. The single-crystal layers 24 and polycrystalline layers 25 of the base layer 22 may be comprised of a semiconductor material that lacks germanium and, in an embodiment, may be comprised entirely of silicon. Similarly, the single-crystal layers 28 and polycrystalline layers 29 of the base layer 22 may be comprised of a semiconductor material that lacks germanium and, in an embodiment, may be comprised entirely of silicon. In an alternative embodiment, the layers 24, 25 of the base layer 22 and/or the layers 28, 29 of the base layer 22 may have a germanium content (e.g., one (1) atomic percent) that is significantly less than the germanium content of the layers 26, 27 of the base layer 22.

The base layer 22 may be formed using a low temperature epitaxial growth process that is non-selective, such as rapid thermal chemical vapor deposition, and during which the composition of the base layer 22 is modulated through control over the deposition conditions. The single-crystal semiconductor material epitaxially grows in the stacked single-crystal layers 24, 26, 28, which are disposed in the sections 48 that are positioned on and over the active regions 14. Polycrystalline semiconductor material forms in the stacked polycrystalline layers 25, 27, 29, which are disposed in the sections 50 that are positioned on and over the trench isolation regions 12. The crystal structure of the single-crystal semiconductor material of the active regions 14 serves as a crystalline template for the growth of the single-crystal layers 24, 26, 28 of the base layer 22 as the composition is modulated during growth, whereas the trench isolation regions 12 do not provide any type of crystalline template resulting in the formation of polycrystalline semiconductor material in the polycrystalline layers 25, 27, 29 of the base layer 22. In an embodiment, the base layer 22 may be doped with a concentration of a p-type dopant (e.g., boron) to provide p-type electrical conductivity and may be in-situ doped during epitaxial growth.

Figure 2:
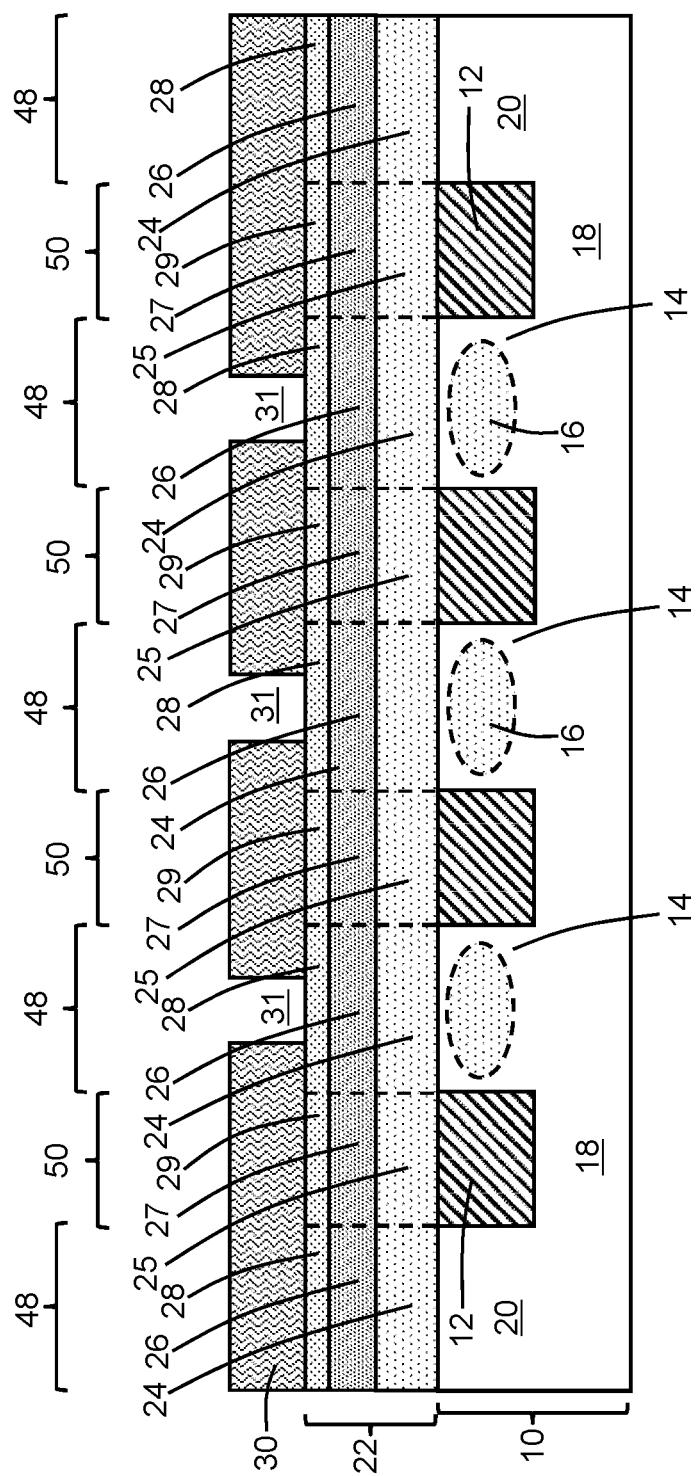
FIG. 2 is a cross-sectional view of the device structure at a fabrication stage subsequent to FIG. 1.

With reference to FIG. 2 in which like reference numerals refer to like features in FIG. 1 and at a subsequent fabrication stage of the processing method, one or more dielectric layers 30 may be formed on the base layer 22 and patterned using photolithography and etching processes to define emitter windows 31. Each emitter window 31 is aligned with the single-crystal layers 24, 26, 28 of the base layer 22 in one of the sections 48.

Figure 3:
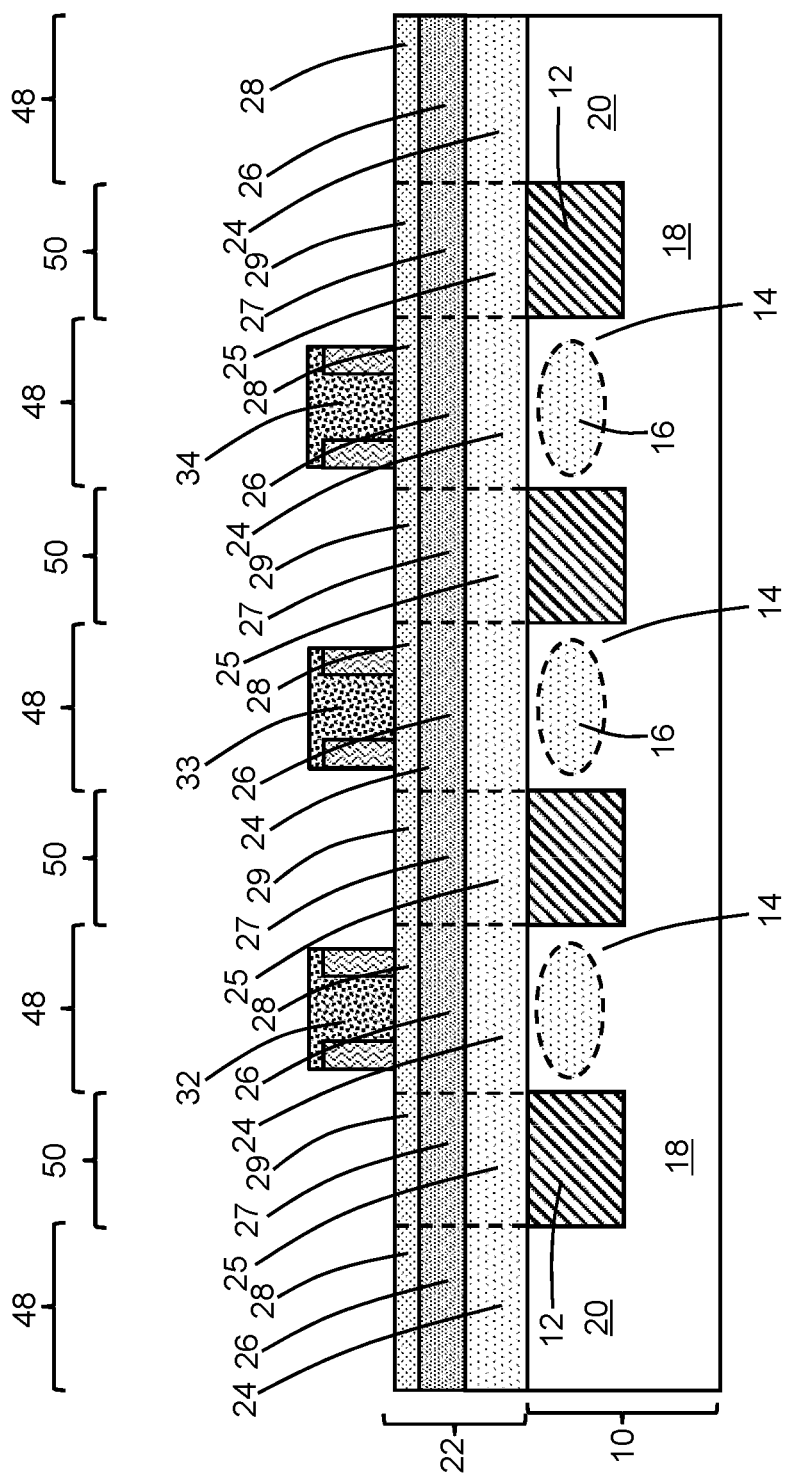
FIG. 3 is a cross-sectional view of the device structure at a fabrication stage subsequent to FIG. 2.

With reference to FIG. 3 in which like reference numerals refer to like features in FIG. 2 and at a subsequent fabrication stage of the processing method, emitter fingers 32, 33, 34 are formed by depositing a semiconductor layer that fills the emitter windows 31 and covers the dielectric layers 30, forming a mask that masks the deposited semiconductor layer over the emitter windows 31, and etching with reactive ion etching to pattern the emitter fingers 32, 33, 34. The emitter fingers 32, 33, 34 may contain a polycrystalline semiconductor material, such as polycrystalline silicon (e.g., polysilicon), deposited by chemical vapor deposition and doped with a concentration of, for example, an n-type dopant (e.g., phosphorus and/or arsenic) to provide n-type electrical conductivity. Each emitter finger 32 may be covered by a cap (not shown) comprised of a dielectric material, such as silicon nitride. The number of active regions 14 and emitter fingers 32, 33, 34 may vary depending on device design.

The polycrystalline layers 27, 29 in the sections 50 of the base layer 22 may be implanted with ions delivering a p-type dopant (e.g., boron and/or indium) under given implantation conditions (e.g., ion species, dose, kinetic energy, implantation angle). The activated dopant in the polycrystalline layers 27, 29 may provide the heterojunction bipolar transistor with a low-resistance extrinsic base that can be used in subsequent fabrication stages for base contact formation.

Figure 4:
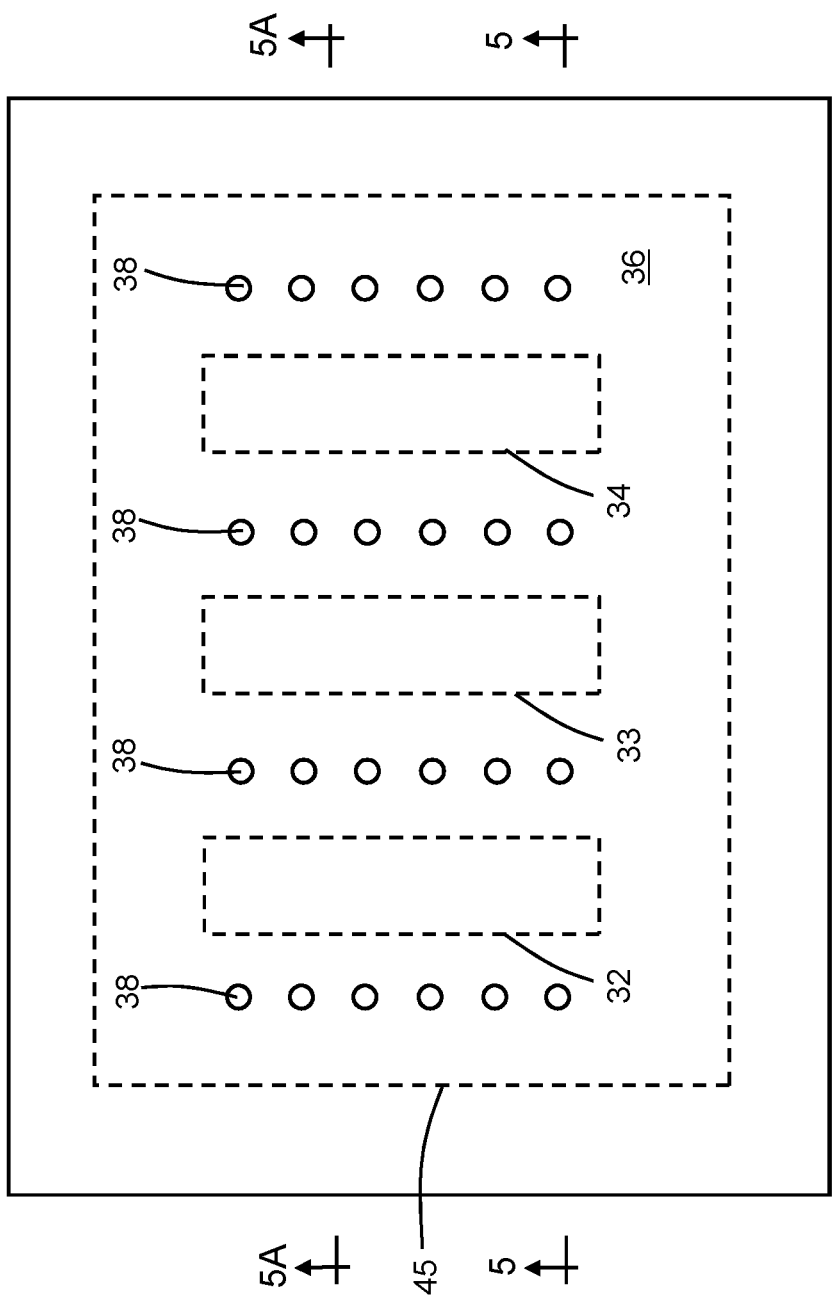
FIG. 4 is a top view of the device structure at a fabrication stage subsequent to FIG. 3.
Figure 5:
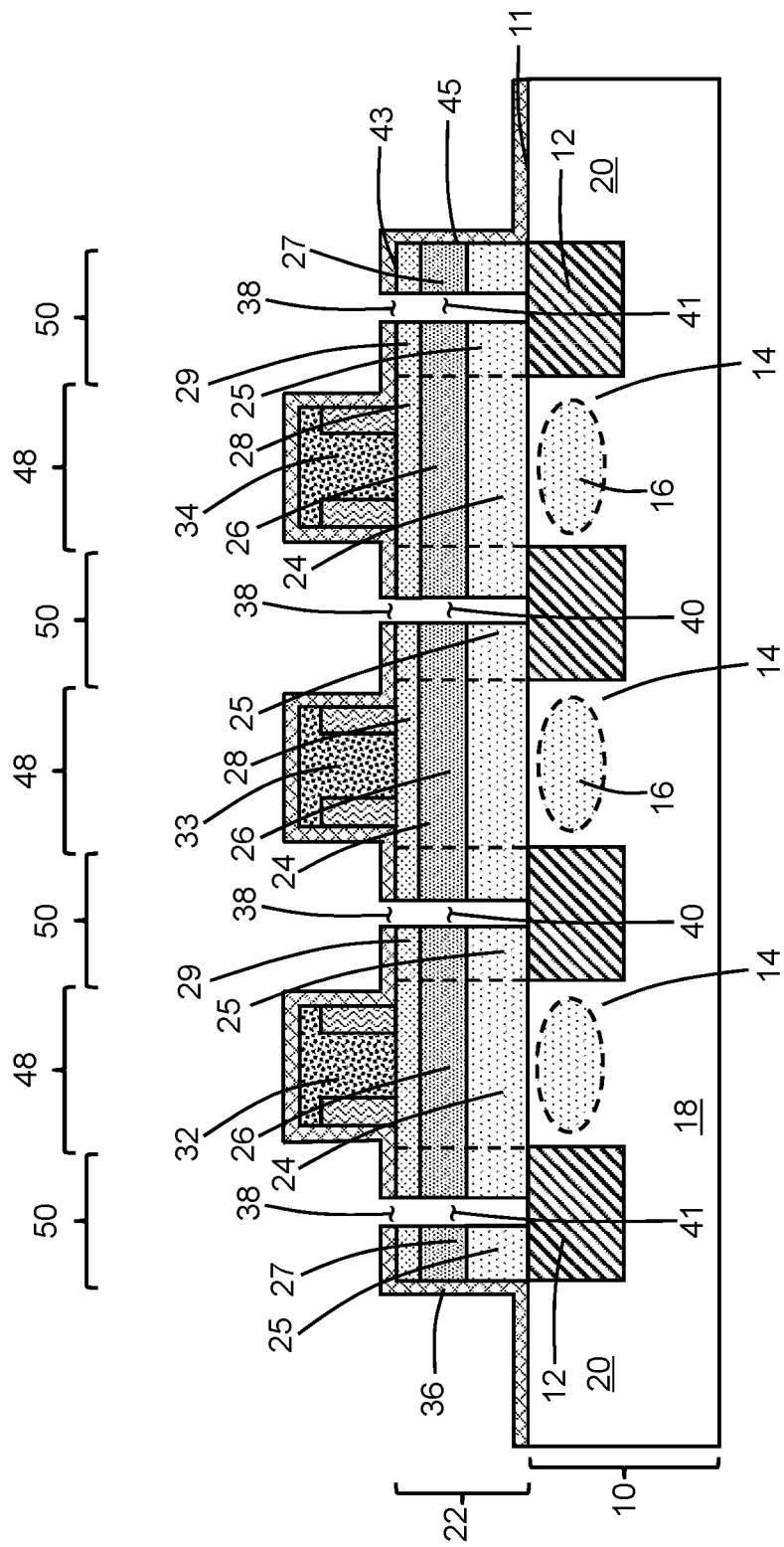
FIG. 5 is a cross-sectional view of the device structure taken generally along line 5-5 in FIG. 4.
Figure 5A:
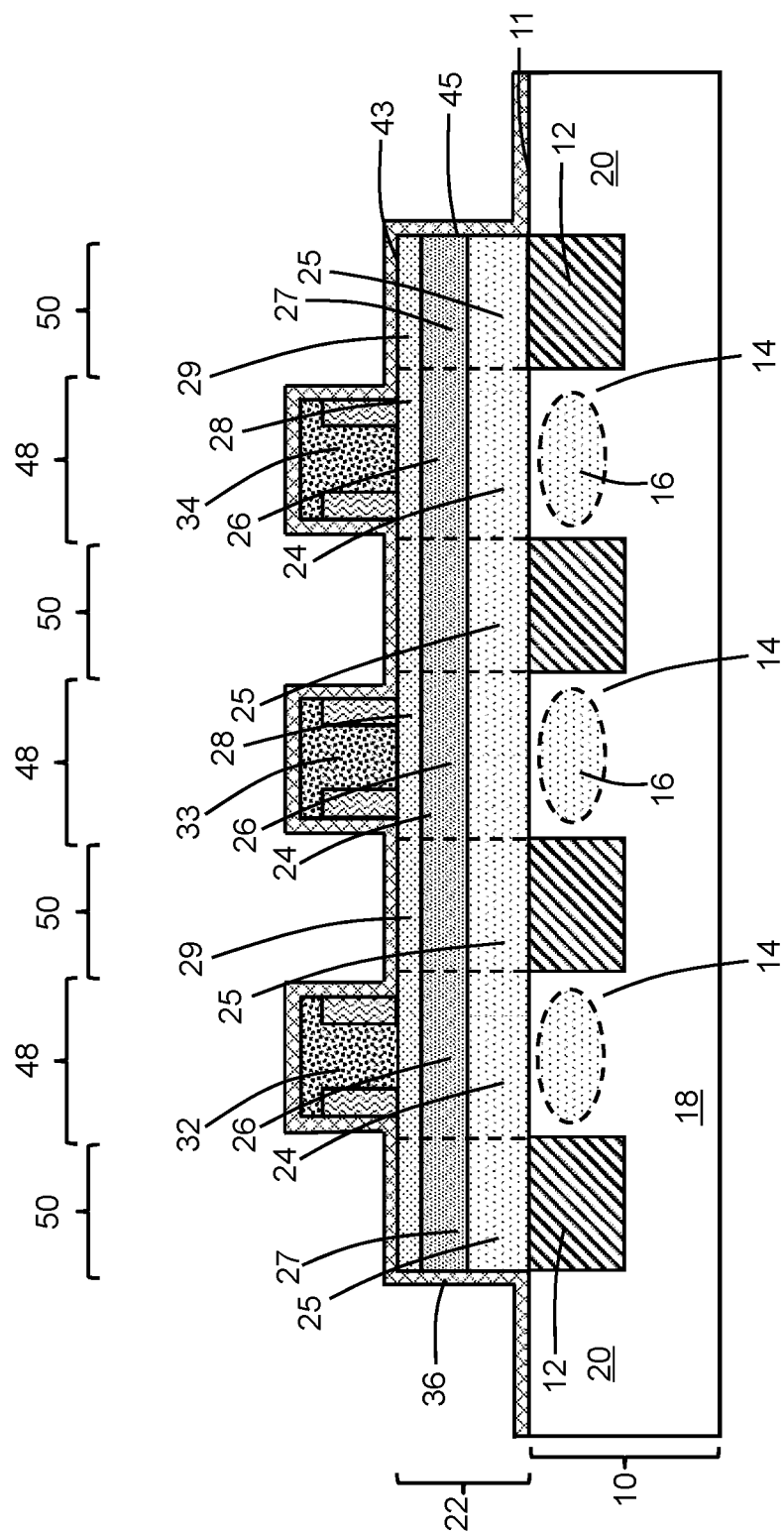
FIG. 5A is a cross-sectional view of the device structure taken generally along line 5A-5A in FIG. 4.

With reference to FIGS. 4, 5, 5A in which like reference numerals refer to like features in FIG. 3 and at a subsequent fabrication stage of the processing method, the base layer 22 is patterned by lithography and etching processes to open the collector contact region 20. The patterned base layer 22 is surrounded by an outer perimeter 45. A dielectric layer 36 is deposited that covers the patterned base layer 22, the emitter fingers 32, 33, 34, and the collector contact region 20. The dielectric layer 36 may be comprised of a dielectric material, such as silicon nitride, and may be conformal. A portion of the dielectric layer 36 extends in a vertical direction from a top surface 43 of the base layer 22 to a top surface 11 of the semiconductor substrate 10. This portion of the dielectric layer 36 defines a sidewall spacer that is positioned adjacent to the outer perimeter 45 of the patterned base layer 22 and, in particular, that abuts and covers the polycrystalline layers 25, 27, 29 of the base layer 22 at the outer perimeter 45. This portion of the dielectric layer 36 is laterally positioned between the outer perimeter 45 of the base layer 22 and the collector contact region 20.

The dielectric layer 36 is patterned by lithography and etching processes to define rows of openings 38 that are laterally spaced relative to each other and that are aligned with the sections 50 of the base layer 22. The openings 38 may have a circular shape as shown, or may have a different shape (e.g., an oval shape).

Openings 40, 41 are subsequently etched in the base layer 22 at the locations of the openings 38 in the dielectric layer 36. The openings 40, 41 extend through the polycrystalline layers 25, 27, 29 of the base layer 22 in each section 50 of the base layer 22. In an embodiment, the openings 40 and/or the openings 41 may extend fully through each polycrystalline layer 29 of the base layer 22 to the trench isolation regions 12. The openings 40 are positioned between adjacent pairs of the emitter fingers 32, 33, 34. The openings 41 are not positioned between adjacent pairs of the emitter fingers 32, 33, 34, but are instead positioned laterally adjacent to the outermost emitter fingers 32 and 34. The etching process forming the openings 40, 41 may be an anisotropic reactive ion etching process that forms vertical or nearly vertical sidewalls, and the dielectric layer 36 furnishes an etch mask for the etching process.

Figure 6:
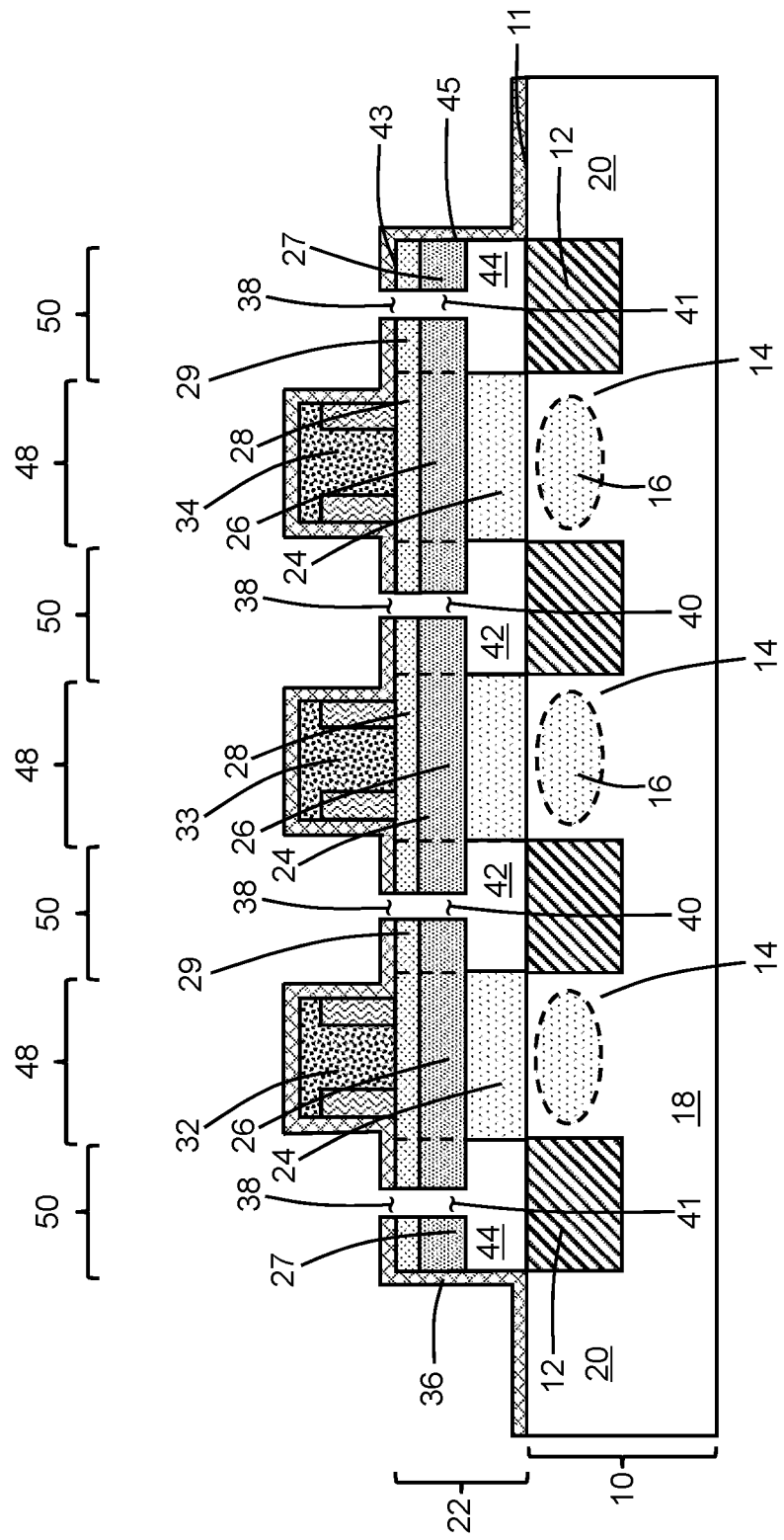
FIGS. 6, 6A are cross-sectional views of the device structure at a fabrication stage subsequent to FIGS. 5, 5A.
Figure 6A:
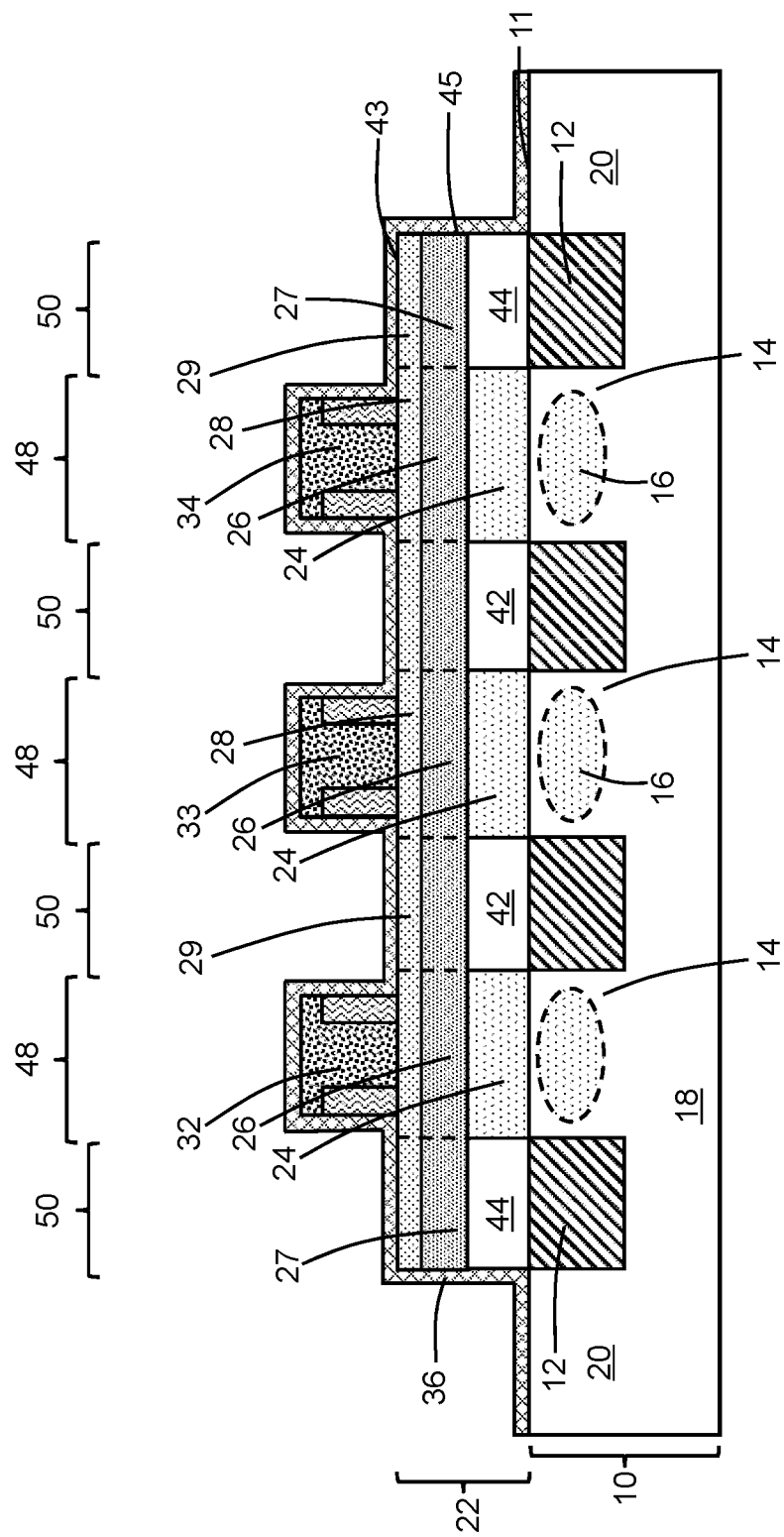

With reference to FIGS. 6, 6A in which like reference numerals refer to like features in FIGS. 5, 5A and at a subsequent fabrication stage of the processing method, the polycrystalline layer 25 may be removed from each of the sections 50 of the base layer 22 in which the polycrystalline layers 25, 27, 29 are perforated by the openings 40, 41. With ingress provided by the openings 38, 40, 41, an isotropic etching process may be used to remove the polycrystalline layer 25 from each section 50 of the base layer 22. The etch chemistry of the isotropic etching process is selected to remove the semiconductor material constituting the polycrystalline layer 25 of the base layer 22 selective to the semiconductor materials constituting the polycrystalline layers 27, 29 of the base layer 22. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The dielectric layer 36 masks and protects the covered portions of the base layer 22 during the performance of the isotropic etch process. The portion of the dielectric layer 36 at the outer perimeter 45 of the base layer 22 may confine the etchant used during the isotropic etching process, and mask the polycrystalline layers 27, 29 of the base layer 22.

In an embodiment, the isotropic etching process etching and removing the polycrystalline layer 25 in each section 50 of the base layer 22 may be a wet chemical etching process. In an embodiment, the polycrystalline layers 25 may be etched and removed using a basic solution containing a base substance, such as potassium hydroxide or ammonium hydroxide. The polycrystalline layer 27 in each section 50 of the base layer 22 may not be etched by the wet chemical etching process because of the compositional difference arising from its germanium content, and the polycrystalline layer 29 in each section 50 of the base layer 22 may not be etched by the wet chemical etching process because of its p-type doping and/or the presence of a germanium content. The retention of the polycrystalline layer 29 in each section 50 of the base layer 22 may ensure that a low extrinsic base resistance is maintained. In an embodiment, the polycrystalline layer 27 in each section 50 of the base layer 22 can also be partially etched if the concentration of germanium in its composition is low. The etching process may be timed, and the polycrystalline layer 25 in the sections 48 of the base layer 22 is either not etched or only partially etched because of a lower etch rate for single-crystal semiconductor material in comparison with polycrystalline semiconductor material of the same composition in the polycrystalline layer 25.

The removal of the polycrystalline layer 25 in each section 50 of the base layer 22 defines cavities 42, 44 in the base layer 22. In an embodiment, the cavities 42, 44 may have dimensions equal to the dimensions of the removed polycrystalline layers 25. The cavities 42, which are laterally arranged between adjacent pairs of the emitter fingers 32, 33, 34, extend parallel to the length of the emitter fingers 32, 33, 34. The cavities 42 are positioned beneath the polycrystalline layers 27, 29 of the sections 50 of the base layer 22 in the spaces between the emitter fingers 32, 33, 34. The cavity 44 extends about the perimeter 45 of the base layer 22, and surrounds the emitter fingers 32, 33, 34, and is positioned beneath the polycrystalline layers 27, 29 of the sections 50 of the base layer 22. In an embodiment, the cavity 44 may extend about the entire perimeter 45 of the base layer 22. The cavities 42, which are laterally bounded by the single-crystal sections 48 of the base layer 22, may be coupled or connected to the cavity 44 to provide a continuous buried void within the base layer 22. One side edge of the cavity 44 is terminated at the outer perimeter 45 of the base layer 22 by the adjacent portion of the dielectric layer 36, and an opposite side edge of the cavity 44 is located adjacent to either single-crystal sections 48 of the base layer 22 or coupled to the cavities 42. Except where perforated by the openings 40, 41, the polycrystalline layers 27, 29 in the sections 50 of the base layer 22 define bridges of semiconductor material that are undercut by the cavities 42, 44.

The device structure of the resulting heterojunction bipolar transistor 46 has a vertical architecture that includes the sections of the collector 16, the emitter fingers 32, 33, 34, and intrinsic base regions provided by the single-crystal semiconductor material of the single-crystal layers 24, 26, 28 in the sections 48 of the base layer 22. Each intrinsic base region is positioned in a vertical direction between one of the emitter fingers 32, 33, 34 and the collector 16 in the corresponding active region 14 to define respective p-n junctions of the heterojunction bipolar transistor 46. The extrinsic base of the heterojunction bipolar transistor 46 includes the polycrystalline layers 27, 29 in the sections 50 of the base layer 22, which are undercut by the cavities 42, 44 and are positioned over the trench isolation regions 12.

The cavities 42, 44 are positioned in the vertical direction between the trench isolation regions 12 and the undercut sections 50 of the base layer 22 with the polycrystalline layers 27 positioned between polycrystalline layers 29 and the cavities 42, 44. The height of the cavities 42, 44 may be substantially equal to the thickness of the removed polycrystalline layer 25 of the base layer 22. In an embodiment, the height of the cavities 42, 44 may be greater than or equal to the thickness of the single-crystal layers 24 of the base layer 22. The preservation of the polycrystalline layers 27, 29 of the base layer 22 over the cavities 42, 44, due to the selective etching process, provides the portion of the extrinsic base undercut by the cavities 42, 44 with a defined thickness.

Figure 7:
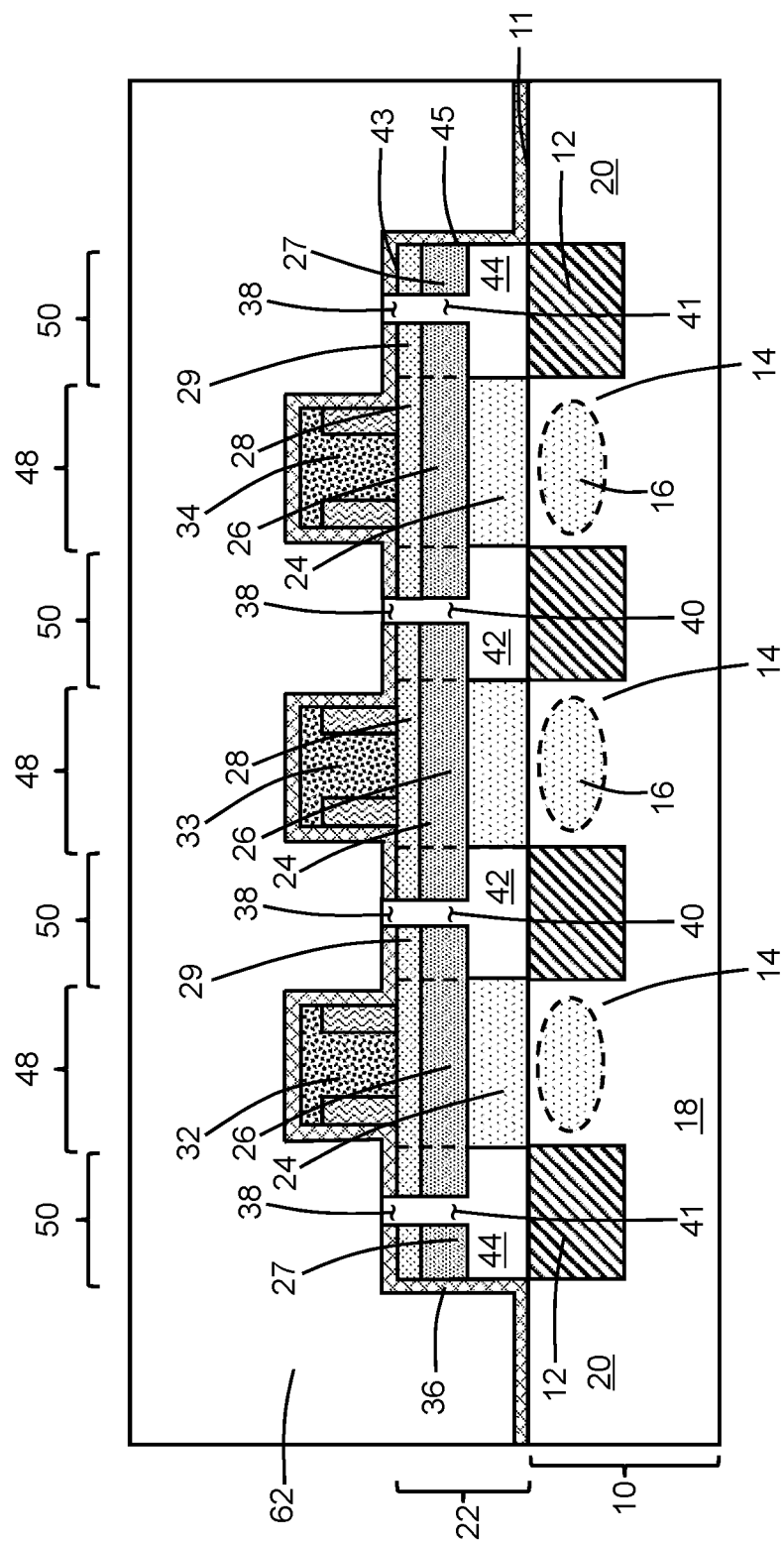
FIGS. 7, 7A are cross-sectional views of the device structure at a fabrication stage subsequent to FIGS. 6, 6A.
Figure 7A:
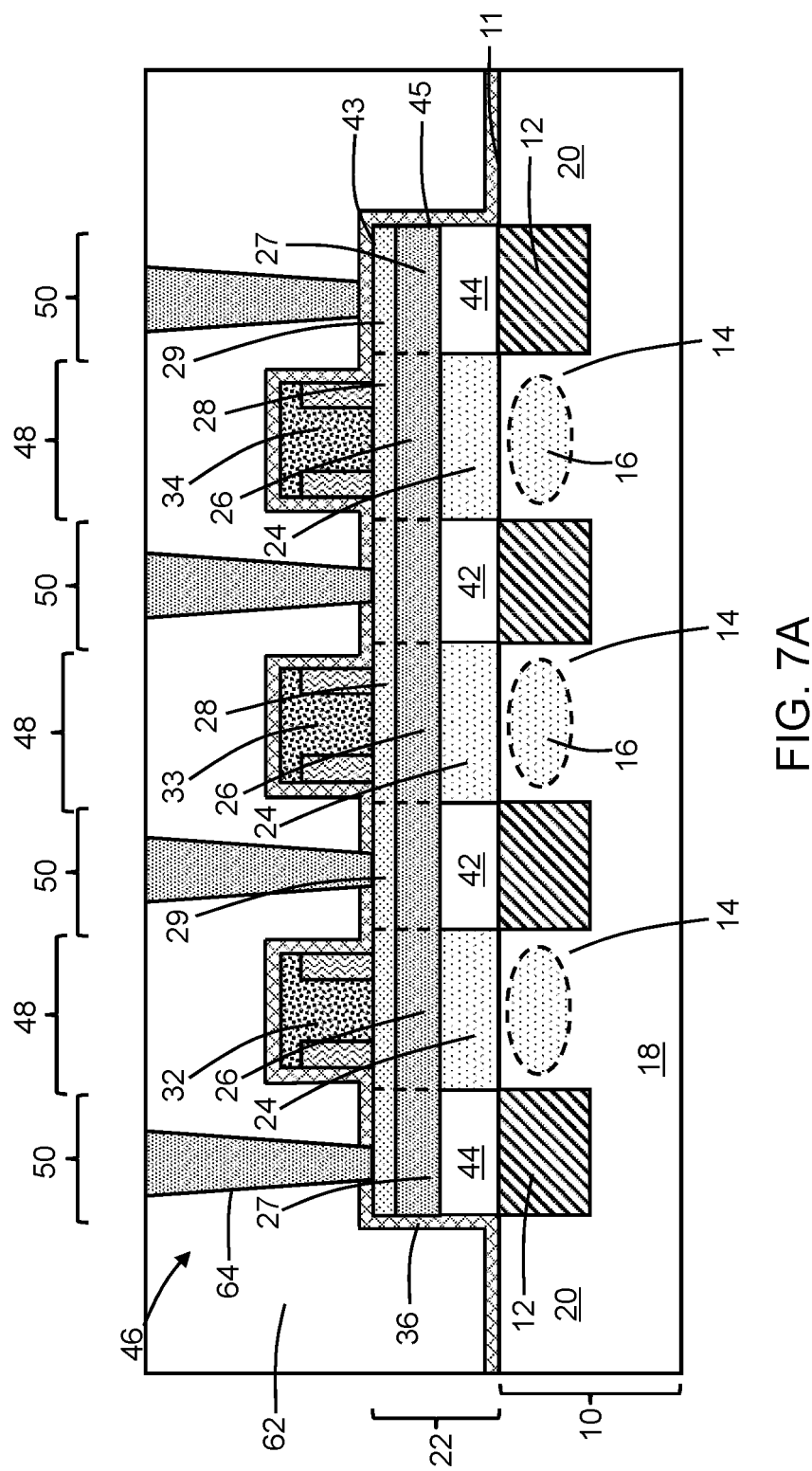

With reference to FIG. 7, 7A in which like reference numerals refer to like features in FIGS. 6, 6A and at a subsequent fabrication stage of the processing method, middle-of-line processing and back-end-of-line processing follow, which includes formation of contacts, vias, and wiring for an interconnect structure coupled with the heterojunction bipolar transistor 46.

An interlayer dielectric layer 62 is formed over the heterojunction bipolar transistor 46. The interlayer dielectric layer 62 may contain a dielectric material, such as an oxide of silicon (e.g., silicon dioxide), deposited by chemical vapor deposition and planarized. Contacts 64 extending to the extrinsic base of the heterojunction bipolar transistor 46 are formed by patterning contact openings formed in the interlayer dielectric layer 62 with a lithography and etching process, followed by filling the contact openings with a conductor, such as tungsten. Contacts (not shown) may also be formed that are coupled with the emitter fingers 32, 33, 34 and collector contact region 20.

The contacts 64 are physically and electrically coupled to the polycrystalline layers 27, 29 of the extrinsic base and, in particular, the contacts 64 are coupled to the bridges of semiconductor material defined by the undercut polycrystalline layers 27, 29 in the sections 50 of the base layer 22. The locations at which the contacts 64 contact the sections 50 of the base layer 22 alternate with the locations of the openings 38 in the dielectric layer 36 along the length of the emitter fingers 32, 33, 34. The resulting arrangement laterally offsets the locations of the contacts 64 from the locations of the openings 38 in the dielectric layer 36.

Figure 8:
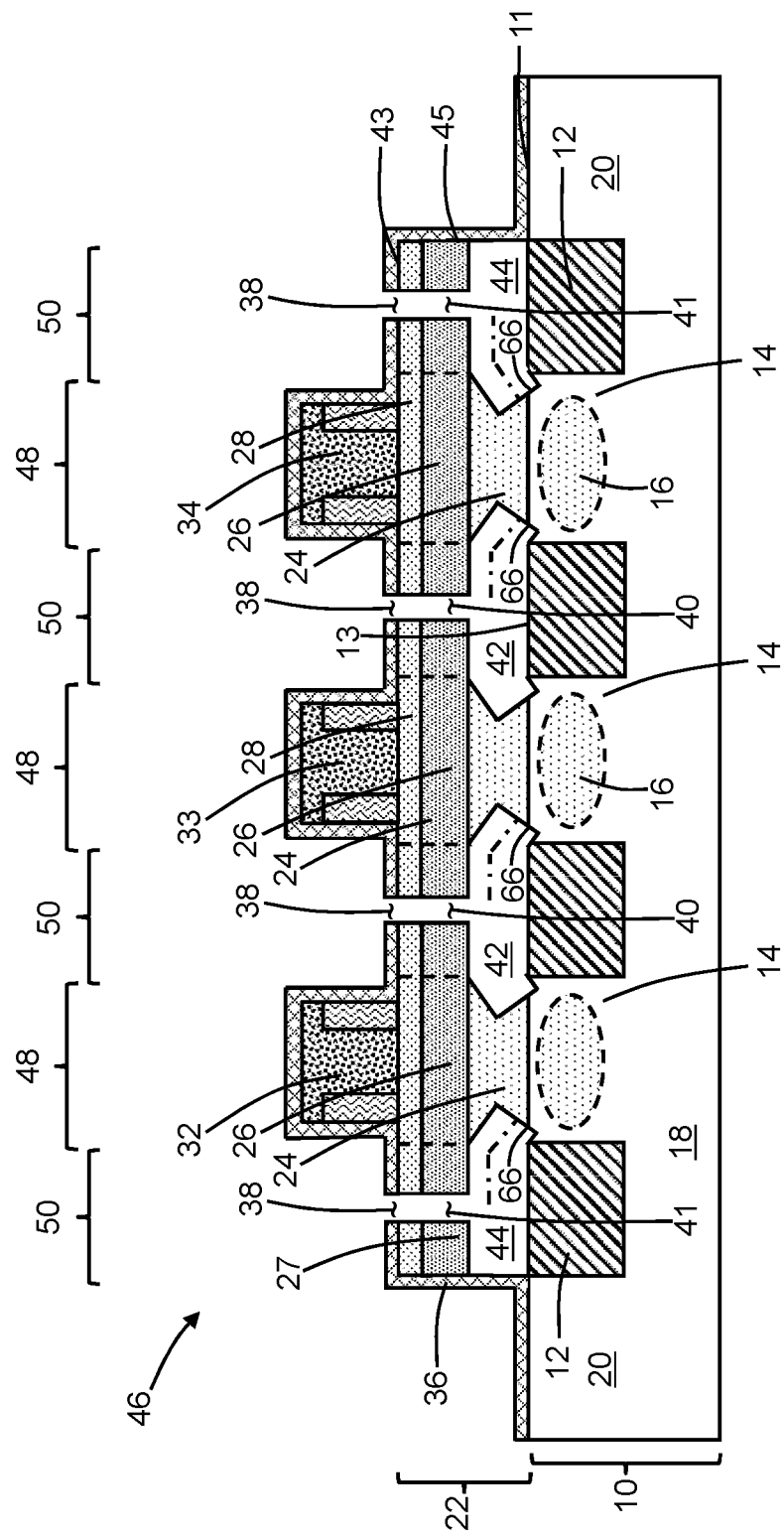
FIG. 8 is a cross-sectional view of a device structure in accordance with alternative embodiments of the invention.

With reference to FIG. 8 and in accordance with alternative embodiments, the isotropic etching process may be lengthened to further enlarge the cavities 42, 44 by removing part of the single-crystal semiconductor material of the single-crystal layer 24 of the base layer 22 and part of the single-crystal semiconductor material of the active region 14. In an embodiment, the isotropic etching process forming the cavities 42, 44 may exhibit a crystallographic orientation dependent in which the kinetics of the etching process may vary according to crystal plane and, in particular, may vary for different low-index crystal planes. Due to these variations in its kinetics, the isotropic etching process may form angled surfaces 66 in (111) planes in the single-crystal semiconductor materials of the single-crystal layer 24 of the base layer 22 and the active region 14, and may proceed at an etch rate in the single-crystal semiconductor materials of the single-crystal layer 24 of the base layer 22 that is less than the etch rate of the polycrystalline layer 25 of the base layer 22. In an embodiment, the angled surfaces 66 may be planar or substantially planar. The dielectric layer 36 at the outer perimeter 45 of the base layer 22 may confine the etchant used during the isotropic etching process forming the cavities 42, 44.

Each of the cavities 42, 44 includes a section positioned over one of the trench isolation regions 12 that may have a uniform height and that extends beneath the polycrystalline layers 27, 29 of the base layer 22 (i.e., the extrinsic base) to the interface 19. Each of the cavities 42, 44 also includes a section that may have a uniform height and that is angled or inclined relative to the section beneath the polycrystalline layers 27, 29 of the base layer 22 toward the active region 14. The change in the orientation of the centerline of the sections of each of the cavities 42, 44 is indicated by the dot-dashed lines in FIG. 8. The angled section of each of the cavities 42, 44 extends, in part, into the single-crystal layer 24 of the base layer 22 and, in part, into the single-crystal semiconductor material of the active region 14 to a depth that is below a top surface 13 of the trench isolation regions 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a heterojunction bipolar transistor, the device structure comprising:

a semiconductor substrate;

a plurality of trench isolation regions positioned in the semiconductor substrate to define a plurality of active regions;

a base layer including a plurality of first sections that are respectively positioned over the active regions and a plurality of second sections that are respectively positioned over the trench isolation regions, the first sections of the base layer including single-crystal semiconductor material, the second sections of the base layer including polycrystalline semiconductor material, and the second sections of the base layer spaced in a vertical direction from the trench isolation regions to define a first cavity that extends about a perimeter of the base layer and a plurality of second cavities surrounded by the first cavity; and a plurality of emitter fingers respectively positioned on the first sections of the base layer adjacent to the second cavities.

2. The device structure of claim 1 wherein the second cavities are positioned in the base layer between the emitter fingers, and the second cavities are connected to the first cavity.

3. The device structure of claim 1 wherein the first cavity extends fully about the perimeter of the base layer.

4. The device structure of claim 1 further comprising:
a dielectric layer including a portion positioned adjacent to the perimeter of the base layer, the portion of the dielectric layer arranged to surround the first cavity.

5. The device structure of claim 4 wherein the semiconductor substrate includes a collector contact region adjacent to the perimeter of the base layer, and the portion of the dielectric layer is positioned laterally between the first cavity and the collector contact region.

6. The device structure of claim 4 wherein the dielectric layer is further positioned over the second sections of the base layer.

7. The device structure of claim 1 wherein the base layer includes a plurality of first openings extending through the second sections of the base layer to the first cavity and a plurality of second openings extending through the second sections of the base layer to the second cavities.

8. The device structure of claim 7 further comprising:
a dielectric layer over the second sections of the base layer, the dielectric layer including a plurality of openings that are coupled with the first openings and the second openings in the base layer.

9. The device structure of claim 7 further comprising:
a plurality of contacts coupled to the second sections of the base layer at locations that are laterally offset from the second openings in the base layer.

10. The device structure of claim 1 wherein the first sections and the second sections of the base layer terminate at the perimeter of the base layer, and the first cavity extends fully about the first sections and the second sections of the base layer.

11. The device structure of claim 1 wherein the first cavity surrounds the emitter fingers, and the second cavities are positioned in the base layer between the emitter fingers.

12. The device structure of claim 1 wherein each first section of the base layer includes a first silicon layer and a first silicon-germanium layer that are positioned over the active regions, and each second section of the base layer includes a second silicon layer and a second silicon-germanium layer that are positioned over the trench isolation regions.

13. The device structure of claim 1 wherein the first sections of the base layer include a single-crystal layer positioned on the active regions, and the first cavity extends beneath the second sections of the base layer to the single-crystal layer of the first sections of the base layer.

14. The device structure of claim 1 wherein the first sections of the base layer include a single-crystal layer positioned on the active regions, and the first cavity includes a first section that extends beneath the second sections of the base layer to the single-crystal layer of the first sections of the base layer and a second section that extends into the single-crystal layer of the first sections of the base layer.

15. The device structure of claim 14 wherein the second section of the first cavity is angled relative to the first section of the first cavity.

16. A method of forming a heterojunction bipolar transistor, the method comprising:
forming a plurality of trench isolation regions in a semiconductor substrate that define a plurality of active regions;

forming a base layer that includes a plurality of first sections including single-crystal semiconductor material that are respectively positioned over the active regions and a second plurality of sections including polycrystalline semiconductor material that are respectively positioned over the trench isolation regions;

removing a first semiconductor layer of each of the second sections of the base layer selective to a second semiconductor layer of each of the second sections of the base layer to define a first cavity and a plurality of second cavities that are positioned in a vertical direction between the second semiconductor layer and the trench isolation regions, wherein the first cavity extends about a perimeter of the base layer and the second cavities are connected to the first cavity; and forming a plurality of emitters respectively positioned on the first sections of the base layer.

17. The method of claim 16 further comprising:
forming a dielectric layer positioned adjacent to the perimeter of the base layer,
wherein the dielectric layer includes a portion that is arranged to surround the first cavity.

18. The method of claim 16 wherein a plurality of first openings extend through the second sections of the base layer to the first cavity, and a plurality of second openings extending through the second sections of the base layer to the second cavities.

19. The method of claim 18 wherein a dielectric layer is formed over the second sections of the base layer, the dielectric layer includes openings that are coupled with the first openings and the second openings in the base layer, and further comprising:
forming a plurality of contacts extending coupled to the second sections of the base layer at locations that are laterally offset from the second openings in the base layer.

20. The method of claim 16 wherein the first sections and the second sections of the base layer terminate at the perimeter of the base layer, and the first cavity extends fully about the first sections and the second sections of the base layer.

* * * * *